(12) United States Patent
Ina

(10) Patent No.: US 6,975,384 B2
(45) Date of Patent: Dec. 13, 2005

(54) EXPOSURE APPARATUS AND METHOD

(75) Inventor: Hideki Ina, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/393,604

(22) Filed: Mar. 21, 2003

(65) Prior Publication Data

US 2003/0193655 A1 Oct. 16, 2003

(30) Foreign Application Priority Data

Mar. 26, 2002 (JP) ....................... 2002-086765

(51) Int. Cl.⁷ .................. G03B 27/52; G03B 27/42
(52) U.S. Cl. ........................ 355/55; 355/53
(58) Field of Search .................. 355/55, 53, 62, 355/72, 77, 67; 356/399, 400, 401; 250/548; 430/311

(56) References Cited

U.S. PATENT DOCUMENTS

| | | | | |
|---|---|---|---|---|
| 5,448,332 | A | | 9/1995 | Sakakibara et al. ........... 355/53 |
| 5,559,582 | A | | 9/1996 | Nishi et al. |
| 5,750,294 | A | | 5/1998 | Hasegawa et al. ............ 430/22 |
| 6,208,407 | B1 | * | 3/2001 | Loopstra ..................... 355/53 |
| 6,476,904 | B1 | * | 11/2002 | Kubo .......................... 355/55 |
| 2002/0167651 | A1 | * | 11/2002 | Boonman et al. ............. 355/67 |
| 2003/0090640 | A1 | * | 5/2003 | Fujisawa et al. .............. 355/53 |

FOREIGN PATENT DOCUMENTS

| | | |
|---|---|---|
| JP | 2-280313 | 11/1990 |
| JP | 06-283403 | 7/1994 |
| JP | 06-097046 | 8/1994 |
| JP | 6-260391 | 9/1994 |
| JP | 6-283403 | 10/1994 |
| JP | 9-45609 | 2/1997 |
| JP | 09-260252 | 3/1997 |
| JP | 2001-093813 | 6/2001 |
| JP | 2002-033268 | 1/2002 |

OTHER PUBLICATIONS

A copy of a Taiwanese Patent Office Action dated Mar. 18, 2004 and a corresponding English Translation of the Office Action.
English Abstract and Translation of Japanese Publication No. 09–260252.
English Abstract and Translation of Japanese Publication No. 06–097046.
English Abstract and Translation of Japanese Publication No. 2002–033268.
English Abstract and Translation of Japanese Publication No. 2001–093813.
English Abstract and Translation of Janpanese Publication No. 06–283403.
Office Action dated Apr. 28, 2005 corresponding to Korean Patent Application No. 10–2003–0018095.
English Translation of Office Action dated Apr. 28, 2005 corresponding to Korean Patent Application No. 10–2003–0018095.
Office Action dated Mar. 23, 2005 corresponding to Japanese Patent Application No. 2002–086765.
English Translation of Office Action dated Mar. 23, 2005 corresponding to Japanese Patent Application No. 2002–086765.

\* cited by examiner

*Primary Examiner*—Peter B. Kim
(74) *Attorney, Agent, or Firm*—Morgan & Finnegan LLP

(57) ABSTRACT

An exposure method for exposing a pattern formed on a reticle onto an object includes a flatness measurement step for measuring the flatness of the object and storing the information obtained, a position measurement step for measuring positions at plural points on the object, and a changing step for changing at least one of the position and tilt of the object on the basis of the information obtained by the flatness measurement step, and information on the position obtained by the position measurement step.

19 Claims, 8 Drawing Sheets

EXPOSURE APPARATUS AND METHOD

BACKGROUND OF THE INVENTION

The present invention relates generally to exposure apparatuses and methods, and more particularly to an exposure apparatus and method for projecting and exposing an object, such as a single crystal substrate for a semiconductor wafer, a glass plate for a liquid crystal display ("LCD").

The fabrication of a device, such as a semiconductor device, an LCD device, and a thin film magnetic head using the lithography technique has employed a projection exposure apparatus that uses a projection optical system to project a circuit pattern formed on a mask or reticle (these terms are used interchangeably in this application) onto a wafer and the like, thereby transferring the circuit pattern.

The projection exposure apparatus has been required to project and expose a circuit pattern on a reticle onto a wafer with higher resolution along with the finer process and higher density of integrated circuits devices. The critical dimension or resolution transferable in the projection exposure apparatus is in proportion to a wavelength of light used for the exposure and in reverse proportion to a numerical aperture (NA) in the projection optical system. Therefore, recent light sources have been in transition from the ultra-high pressure mercury lamp (including g-line (with a wavelength of about 436 nm) and i-line (with a wavelength of about 365 nm)) to a KrF excimer laser with a shorter wavelength (i.e., a wavelength of about 248 nm) to the ArF excimer laser (with a wavelength of about 193 nm), and practical use of the $F_2$ laser (with a wavelength of about 157 nm) is also being promoted. A further expansion of the exposure area has been also required.

In order to satisfy these requirements, a step-and-repeat exposure apparatus (also referred to as a "stepper") for entirely projecting and exposing an approximately square exposure area onto a wafer with a reduced exposure area has been replaced mainly with a step-and-scan exposure apparatus (also referred to as a "scanner") for accurately exposing a wide screen of exposure area through a rectangular slit with relatively and quickly scanning the reticle and the wafer.

In exposure, the scanner uses a surface-position detector in an oblique light projection system to measure a surface position at a certain position on the wafer before the exposure slit area moves to the certain position on the wafer, and correctingly accords the wafer surface with an optimal exposure image-surface position when exposing the certain position, thereby reducing influence of the flatness of the wafer. In particular, there are plural measurement points in longitudinal direction of the exposure slit, i.e., a direction orthogonal to the scan direction, at front and back stages to the exposure slit area to measure an inclination or tilt of the surface as well as a height or focus of the wafer surface position. In general, the scan exposure proceeds in both directions from the upper stage and from the back stage. Therefore, these measurement points are arranged at front and back stages to the exposure slit area so as to measure the focus and tilt on the wafer before exposure. Japanese Laid-Open Patent Application No. 9-45609 (corresponding to U.S. Pat. No. 5,750,294) discloses, for example, a method for measuring such focus and tilt.

Japanese Laid-Open Patent Application No. 6-260391 (corresponding to U.S. Pat. No. 5,448,332) proposes, as a method for measuring a surface position on a wafer in a scanner and for correction the same, an arrangement of plural measurement points on a pre-scan area other than the exposure area to measure the focus and tilt in scan and non-scan directions. Japanese Laid-Open Patent Application No. 6-283403 (corresponding to U.S. Pat. No. 5,448,332) proposes as a method for measuring the focus and tilt in the scan and non-scan directions and for driving and correcting the same, by arranging plural measurement points in the exposure area.

A description will be given of these proposals with reference to FIGS. 10 and 11. Here, FIG. 10 is a schematic sectional view of focus and tilt measurement points FP1 to FP3 on the wafer 1000. FIG. 11 is a schematic sectional view showing the wafer 1000 that has been driven to an optimal exposure image-surface position based on the measurement results. Referring to FIG. 10, the focus and tilt are sequentially measured at the measurement points FP1 to FP3 on the wafer 1000. A pre-scan plane PMP is calculated based on the measurement results from the measurement points FP1 to FP3, and the orientation of the wafer is driven and adjusted to the best focus plane BFP in moving the wafer 1000 to the exposure position or exposure slit 2000, as shown in FIG. 11.

However, the recent increasingly shortened wavelength of the exposure light and the higher NA of the projection optical system have required an extremely small depth of focus ("DOF") and a stricter accuracy with which the wafer surface to be exposed is aligned to the best focus position BFP or so-called focus accuracy.

In particular, they have also required stricter measurement and precise correction of the tilt of the wafer surface in the scan direction or width direction of the exposure slit. A wafer having an insufficiently flat surface has disadvantageous focus detection accuracy in the exposure area. For example, when the exposure apparatus has a DOF with 0.4 µm, the flatness of the wafer requires several nanometer order, for example, the flatness of the wafer needs 0.08 µm where it is one-fifth as long as the DOF, or 0.04 µm where it is one-tenth as long as the DOF.

In addition, while a surface-position detector in the oblique light projection system measures the wafer's surface position before the area hangs over the exposure slit, the measurement timing is discrete and no information is available or considered about the wafer's flatness between two timings. As a result, there is no information available between timings of the flatness of the wafer.

For example, this measurement timing is at an interval of 3 mm on the wafer 1000 in the scan direction as shown in FIG. 12. Then, the wafer 1000 has such an insufficient flatness due to lack of the information for a distance of 3 mm, e.g., between points P1 to P2 in FIG. 12 that the front position may offset by Δ from the pre-scan plane PMP calculated by the measurement at the interval of 3 mm. Here, FIG. 12 is a schematic sectional view showing an offset of flatness between the pre-scan plane PMP and the wafer 1000.

In exposure, the pre-scan plane PMP is adjusted to the best focus plane BFP, and the exposure in FIG. 12 needs a shift by the amount of Δ. This shift occurs in a direction orthogonal to the scan direction as well as the scan direction. This results from an arrangement of measurement points in the above oblique light projection system, rather than the measurement timing.

The finer measurement timing in the scan direction and the increased number of measurement points in the oblique light projection system would reduce an offset error, but might disadvantageously lower the throughput due to the deteriorated scan speed in exposure time, increase measurement time, rise cost together with the complicated apparatus structure, and grows likelihood of troubles.

BRIEF SUMMARY OF THE INVENTION

Accordingly, it is an exemplified object of the present invention to provide an exposure method and apparatus for performing a superior focus correction for the flatness of the wafer surface without lowering the throughput.

An exposure method of one aspect of the present invention for exposing a pattern formed on a reticle onto an object includes a flatness measurement step for measuring and for storing the flatness of the object, a position measurement step for measuring positions at plural points on the object, and a control step for controlling at least one of the position and tilt of the object using information of the flatness obtained by the flatness measurement step, and information on the position obtained by the position measurement step. The position measurement step may be conducted in an exposure apparatus, whereas the flatness measurement step measures the flatness of the object inside or outside the exposure apparatus.

Other objects and further features of the present invention will become readily apparent from the following description of the embodiments with reference to accompanying drawings.

DETAILED DESCRIPTION OF THE PREFERRED EMBODIMENTS

The instant inventor has discovered that the flatness of the wafer, in particular, the flatness among measurement points (e.g., at an interval of 3 mm) of a wafer supported on a wafer chuck in an exposure apparatus does not vary during a semiconductor process. In other words, the flatness of the original wafer without a resist or pattern before the semiconductor fabrication process is the same as the flatness of the wafer that has experienced the process including, for example, an oxide-film formation and a metal process.

A process that heats up the entire wafer might cause a whole contraction, a temperature difference between the front and rear surfaces, and thus a rough shape as a whole. However, when the wafer is supported on a wafer chuck in an exposure apparatus, which rectifies its flatness, the wafer surface does not have such a rough shape. The issue in this case is the flatness in a minute interval of, for example, 3 mm that has existed in the wafer before the semiconductor fabrication process.

A description will be given of an exposure apparatus of one embodiment according to the present invention with reference to the accompanying drawings. However, the present invention is not limited to these embodiments, and each element is replaceable within a scope of the present invention. Here, FIG. 1 is a schematic block diagram of the exposure apparatus 1 of one embodiment according to the present invention.

Figure 1:
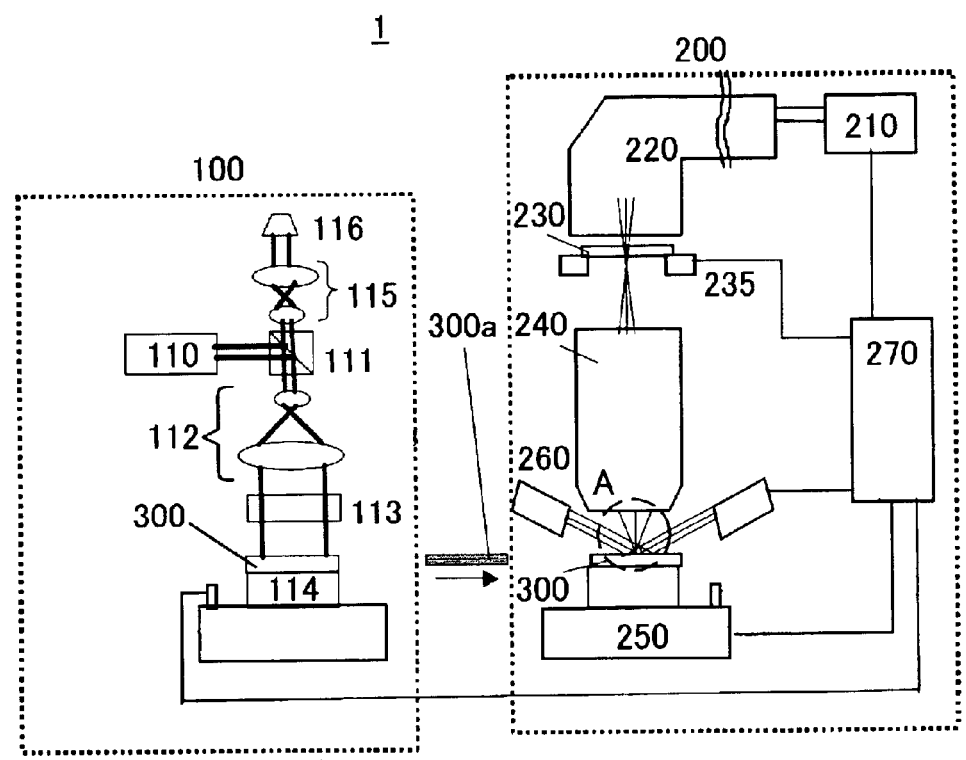
FIG. 1 is a schematic block diagram of an exposure apparatus of one embodiment according to the present invention.

The exposure apparatus includes, as shown in FIG. 1, a measurement station 100 and an exposure station 200, and serves as a projection exposure apparatus that exposes onto a wafer a circuit pattern created on the reticle, e.g., in a step-and-repeat or a step-and-scan manner. Such an exposure apparatus is suitable for a sub-micron or quarter-micron lithography process, and this embodiment exemplarily describes a step-and-scan exposure apparatus (which is also called "a scanner").

A description will now be given of the measurement station 100 that measures the flatness of the entire wafer 300 before the semiconductor fabrication process starts. Each wafer 300, a silicon wafer without a resist or pattern which is ready for the semiconductor process, is fed to the measurement station 100, which in turn measures the entire flatness before the wafer is fed to the exposure station 200 in order to lead the wafer to the semiconductor process. A spin coater has not yet formed any resist on a surface of the wafer 300. The instant embodiment measures a surface shape of the entire wafer 300 using, a principle of a Fizeau interferometer.

The light emitted from a light source of the interferometer, such as a He—Ne laser 110, is reflected by a beam splitter 111, and expanded to a wafer size to be inspected by a beam expander 112, before entering a mirror 113 used to generate reference light. The reference-light mirror 113 has one reflective surface, and uses the reflected light on the surface as the reference light that interferes with the reflected light from an object to be inspected. Although the light reflected by mirror 113 is used as the reference light and thus 113 is referred to as a reference-light mirror, the transmission light through this mirror is more than the reflected light in order to improve the visibility as contrast of interference fringes. The instant embodiment inspects the silicon wafer, and its reflectance is about 60% for the He—Ne laser with an oscillation wavelength of 633 nm. Since more improved visibility of interference fringes is available when the reflected light from the inspected object and reference light has the same intensity on a surface that forms interference fringes, i.e., a surface of a CCD camera 116, the transmittance T on the one surface of the reference-light mirror 113 is calculated by the following equation 1 where R is the reflectance on the one surface of the reference-light mirror 113:

$$T + R = 1$$
$$0.6T^2 = R \qquad \text{EQUATION 1}$$

It is thus understood that the transmittance T is 0.703 and the reference-light mirror 113 preferably transmits 70% of light.

The light that has passed the reference-light mirror 113 illuminates the surface of the wafer 300 as an object to be inspected, which has been supported on a wafer chuck 114. The light reflected on the wafer 300 passes through the reference-light mirror 113, the beam expander 112, and the beam splitter 111, and is expanded by a beam expander 115 to the size suitable for the CCD camera 116 for photoelectric conversion of the interference fringes of the light that has transmitted through the beam splitter 111. The light incident upon the CCD camera 116 is photo-electrically converted into a video signal representative of information of flatness of the wafer 300.

Then, the interval available to obtain from the flatness information on the wafer 300 is calculated. Suppose that the CCD camera 116 has a photoelectric surface of ⅔ inches and each interval of light receiving cells are 13 μm. In addition, suppose that the wafer size to be inspected has a diameter of 12 inches or 300 mm. The size of photoelectric surface of ⅔ inches is 6.6×8.8 mm² and thus may receive light with a diameter of 6 mm.

Accordingly, the diameter of 300 mm is set to be a diameter of 6 mm. In other words, when the optical magnification from the wafer 300 to the CCD camera 116 is set to 6/300=1/50, the separable interval on the wafer 300 becomes 13×50=650 μm from the interval between the light receiving cells of 13 μm in the CCD camera 116.

Thus, one piece of information on the flatness is obtained from one pixel in the CCD camera 116. This may measure the flatness of the wafer 300 for each 0.65 mm, and provide the information of flatness between the measurement interval of, for example, 3 mm, the focus measurement in the scan direction in the exposure station 200.

The measurement station 100 may measure the flatness of the wafer 300 using the principle of the Fizeau interferometer more precisely than a detection system 260 for detecting the focus and tilt in the exposure station 200, and obtain the flatness information of the wafer 300 between detection intervals of the detection system 260. When this flatness information is converted into a database for each wafer and made available as a reference table to a controller 270 in the exposure station 200, each wafer may be recognized in the advanced stage in the semiconductor process and exposed based on this flatness information and focus and tilt information of the wafer 300 detected in the exposure station 200.

The wafer 300 is moved to the exposure station 200 as shown in FIG. 1 after its flatness information has been measured by the measurement station 100 before the exposure, and then the exposure station 200 exposes the wafer 300 based on the flatness information of the wafer 300. The moving wafer 300 is the best configuration because one by one movement does not stop the whole stream for high throughput, but the wafer carrier (not shown) etc. may move every twenty-five wafers, for example, to the exposure station 200 when the decreased throughput is permissible to some extent.

A description will now be given of the exposure station 200. The light emitted from a light source 210, such as an excimer laser, illuminates a pattern formed on a reticle 230 through an illumination optical system 220 that converts the light into exposure light with an optimal shape. The pattern on the reticle 230 includes an IC circuit pattern to be exposed, and the light emitted through the pattern forms an image near the wafer 300 surface as an image surface through a projection optical system 240.

The reticle 230 is mounted on a reticle stage 235 movable in a plane orthogonal to an optical axis of the projection optical system 240 and in the optical-axis direction.

The wafer 300 is brought in from the measurement station 100 and mounted on a wafer stage 250 movable in a plane orthogonal to an optical axis of the projection optical system 240 and in the optical-axis direction.

Each shot area on the reticle 230 is exposed by relatively scanning the reticle stage 235 and wafer stage 250 at a speed corresponding to a ratio of an exposure magnification. After one shot of exposure ends, the wafer stage 250 is stepped to the next shot and next shot is exposed by the scan exposure in the reverse direction to the previous one. This repeats to expose the entire shot area on the wafer 300.

During the scan exposure of one shot, the detection system 260 obtains surface position information on the surface of the wafer 300 to measure the focus and tilt, calculates the offset amount from the exposure image surface, and drives the stage 250 in focus (or height) and tilt (or inclination) directions, aligning the wafer 300 surface in the height direction for almost each exposure slit.

The detection system 260 uses an optical height measurement system using a method for introducing light to the wafer 300 surface at a large angle (or low incident angle) and detecting an image offset of the reflected light from the wafer using a position detecting element, such as a CCD camera. It projects light to plural measurement points on the wafer 300, introduces each light to an individual sensor, and calculates the tilt of a surface to be exposed based on the height measurement information of different positions.

Figure 3:
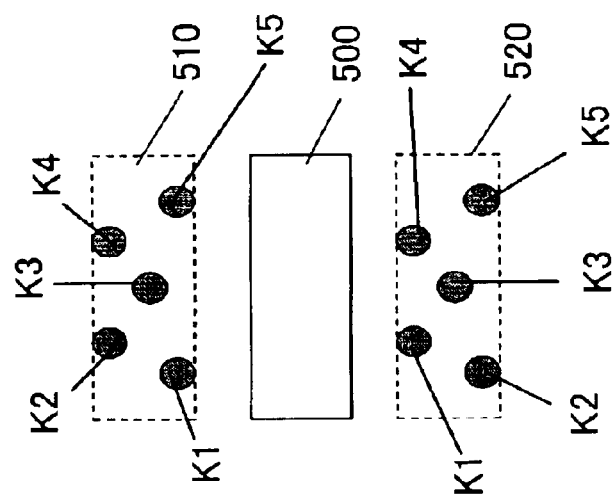
FIG. 3 is a schematic view of an exposure area that includes five measurement points.
Figure 2:
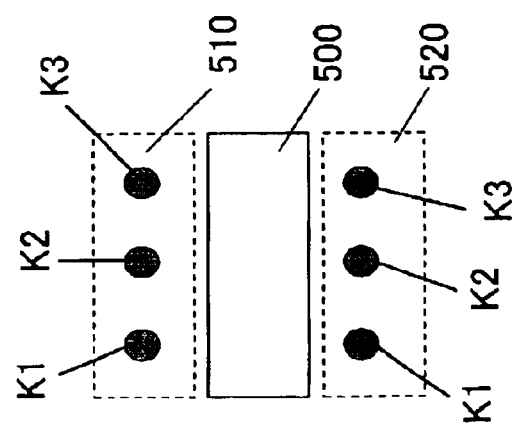
FIG. 2 is a schematic view of an exposure area that includes three measurement points.

Plural measurement points K1 to K5 are arranged, as shown in FIGS. 2 and 3, to form a surface shape in the front and back areas 510 and 520 in the exposure area 500 (or exposure slit) 500, so as to simultaneously measure focus and tilt information of the wafer 300, in particular, tilt information in the scan direction before the exposure slit in the scan exposure moves to the exposure area 500. FIGS. 2 and 3 are schematic views of the measurement points K1 to K5 for the exposure area 500, in which FIG. 2 shows three measurement points K1 to K3 while FIG. 3 shows five measurement points K1 to K5.

FIG. 3 arranges five measurement points K1 to K5 to be projected in the front area 510 for the exposure area 500 so as to precisely obtain focus and tilt information just before the exposure to the exposure area 500, and drive and correct an exposure position. Similarly, five measurement points K1 to K5 are to be projected in the back area 520 for the scan exposure in the reverse direction.

Figure 4:
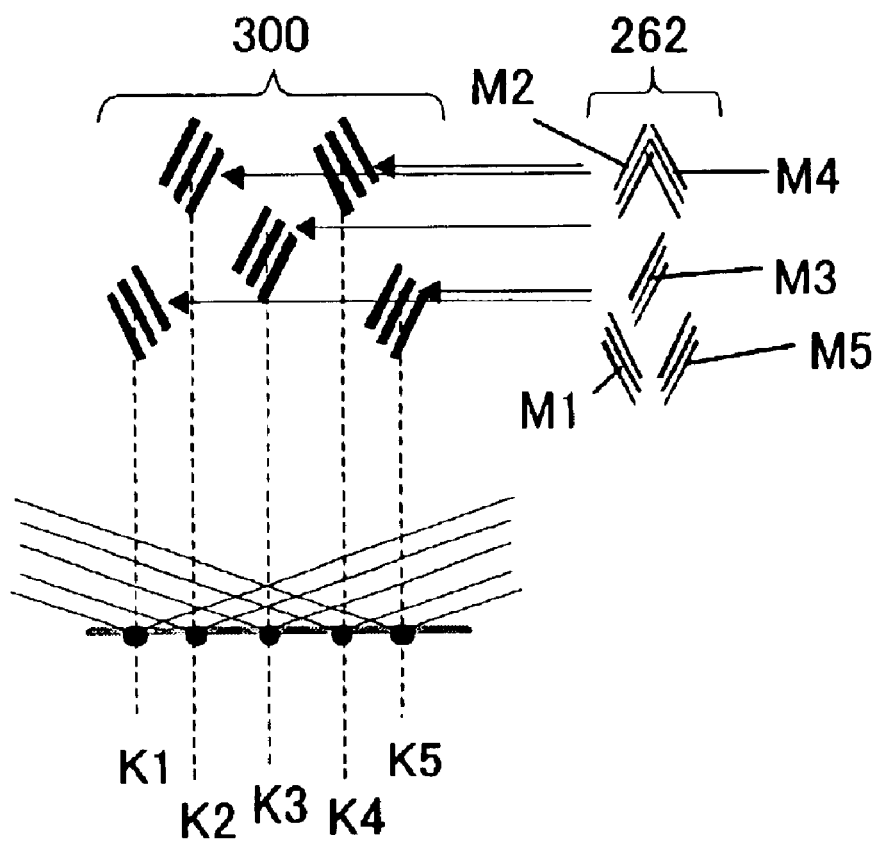
FIG. 4 is a schematic optical view showing a measurement system of an exposure station shown in FIG. 1.

FIG. 4 shows an enlarged view of an area A in FIG. 1. Here, FIG. 4 is a schematic optical view showing a focus and tilt measurement system in the exposure station 200, although FIG. 4 shows only five measurement points K1 to K5 in the focus and tilt measurement area (for instance, the front area 510) for illustrative convenience. In particular, the instant embodiment illustrates an arrangement of marks M2 to M5 wherein an interval between the measurement points K2 and K4 is different from that among the measurement points K1, K3 and K5. Plural optical axes for the focus and tilt measurement are aligned with a direction orthogonal to the scan direction. These marks M1 to M5 to be projected at the measurement points K1 to K5 are rotated by a certain amount in a section perpendicular to the optical axis of the focus and tilt measurement optical system and then projected. As a result, the measurement slit faces obliquely on the wafer 300 and the slit pitch direction directs to the central measurement position.

Figure 5:
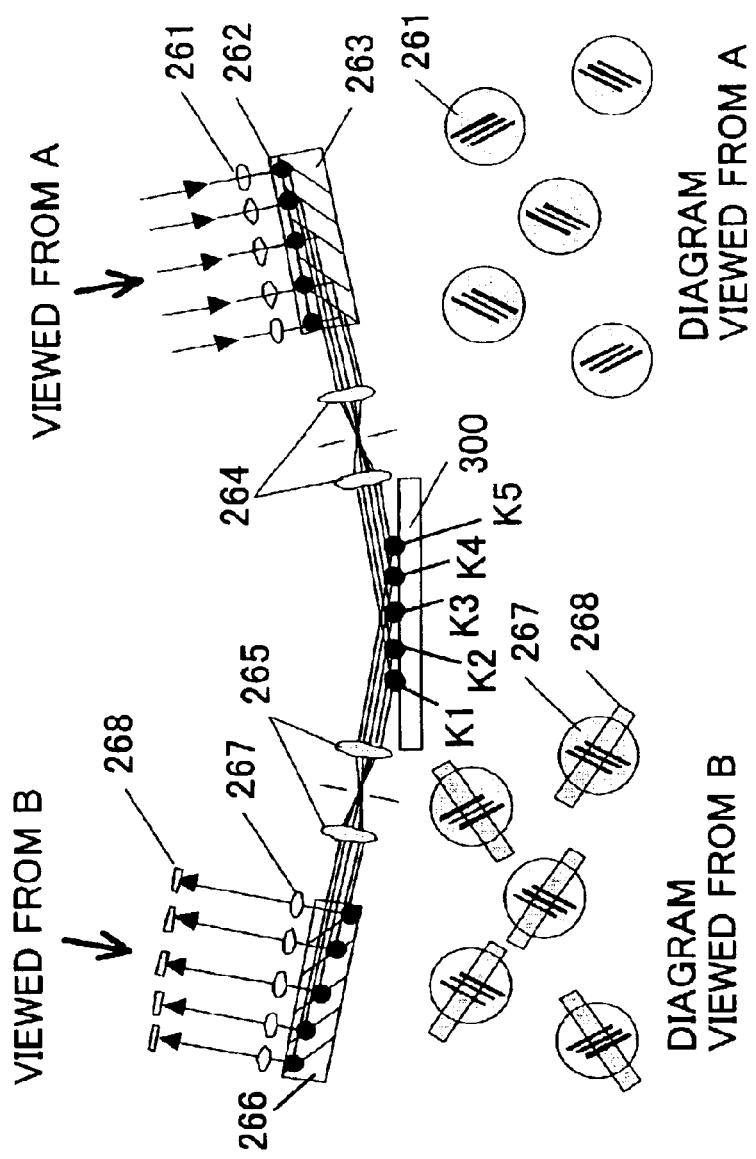
FIG. 5 is a schematic arrangement view of a measurement optical system that realizes an arrangement of measurement points shown in FIG. 4.

FIG. 5 is a schematic arrangement view of the measurement optical system for realizing an arrangement of the measurement points shown in FIG. 4. Five illumination lenses 261 allows the light supplied from the light source (not shown) to illuminate slit marks for the focus measurement formed on the projection pattern mask 262 for the focus and tilt measurements. The light source preferably employs a halogen lamp or LED with such a relatively wide wavelength that the light does not expose the photoresist on the wafer 300 or is not affected by interference in the resist thin film. The mask 262 forms slit marks for plural measurement points as shown in a diagram viewed from a direction A. An optical-path synthesizer prism 263 synthesizes optical paths of beams formed from illuminated plural measurement marks, and a focus mark projection optical system 264 projects the light onto the wafer 300 obliquely.

The light reflected on the wafer 300 surface forms an intermediate imaging point in an optical-path division prism 266 through the focus light-receiving optical system 265. After the optical-path division prism 266 divides the optical path for each measurement point, an enlargement detection optical system 267 arranged for each measurement point in order to improve measurement resolution introduces the light to a position detection element 268 for each measurement point. Each position detection element 268 uses one-dimensional CCD in this embodiment, and the arrangement direction of the elements is the measurement direction. A diagram viewed from the direction B shows a relationship among the measurement marks, the position detection element 268, and the enlargement detection optical system 267. The position detection element 268 for each measurement point is provided in a direction orthogonal to the slit mark.

The position detection element 268 uses a one-dimensional CCD, but may arrange a two-dimensional CCD. Alternatively, it may be adapted to form a reference slit plate on a light-receiving element imaging surface, scan light in front of the reference slit plate, and detect a transmission light volume through the reference slit plate.

Figure 6:
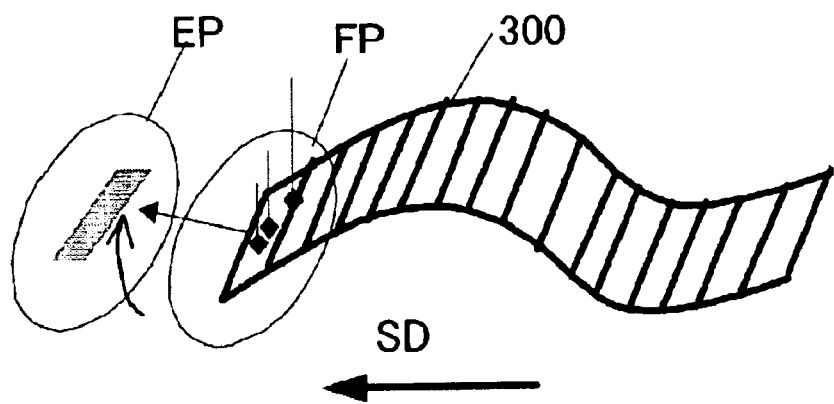
FIG. 6 is a schematic perspective view showing exposure position and focus and tilt measurement positions on a wafer.
Figure 7:
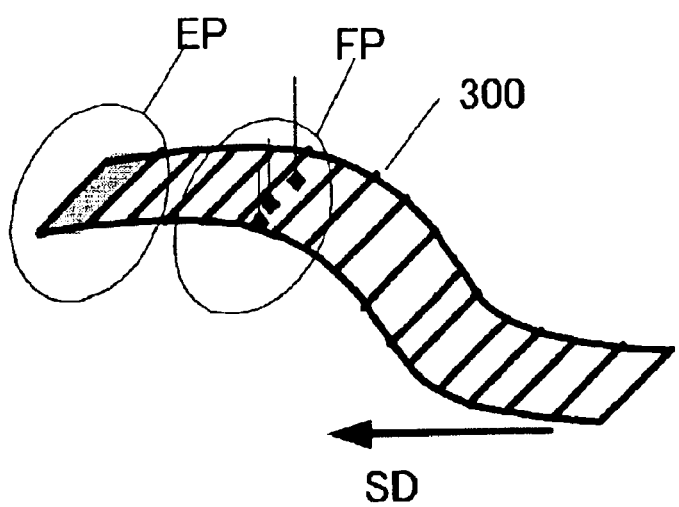
FIG. 7 is a schematic perspective view showing the wafer that has been drive to the exposure position based on flatness information of the wafer obtained by measurement and exposure stations in FIG. 1.

A description will be given of an overview of a surface position correction in the focus and tilt measurement at the scan exposure. Before the exposure position EP moves to the wafer 300 with a rough shape in a scan direction SD, the focus of the surface position of the wafer 300, the tilt in the longitudinal direction in the exposure slit (or a direction perpendicular to the scan direction SD) (which tilt is referred to as "tilt X") as well as the tilt in the width direction in the exposure slit (which tilt is referred to as "tilt Y") are conducted, as shown in FIG. 6, plural focus and tilt positions FP arranged so as to form a plane in front of the exposure slit. Based on the information of the measurement and flatness information of the wafer 300 as a database, the controller 270 provides a corrective driving, as shown in FIG. 7, to drive the wafer stage 250 to the exposure position EP. In FIG. 7, the correction has been completed so as to expose the exposure slit when the exposure slit moves to the area that has been measured before the exposure. The controller 270 may communicate with the measurement station 100, and obtains and stores a database of the flatness of the wafer 300 that has been obtained from the measurement station 100. Here, FIG. 6 is a schematic perspective view showing the exposure position EP, focus and tilt measurement positions FP on a wafer 300. FIG. 7 is a schematic perspective view showing the wafer 300 that has been drive to the exposure position EP based on flatness information of the wafer 300 obtained by measurement and exposure stations 100 and 200.

The above description refers to an arrangement of five measurement points in each surface position measurement area, but is applicable to an arrangement of three measurement points.

Figure 8:
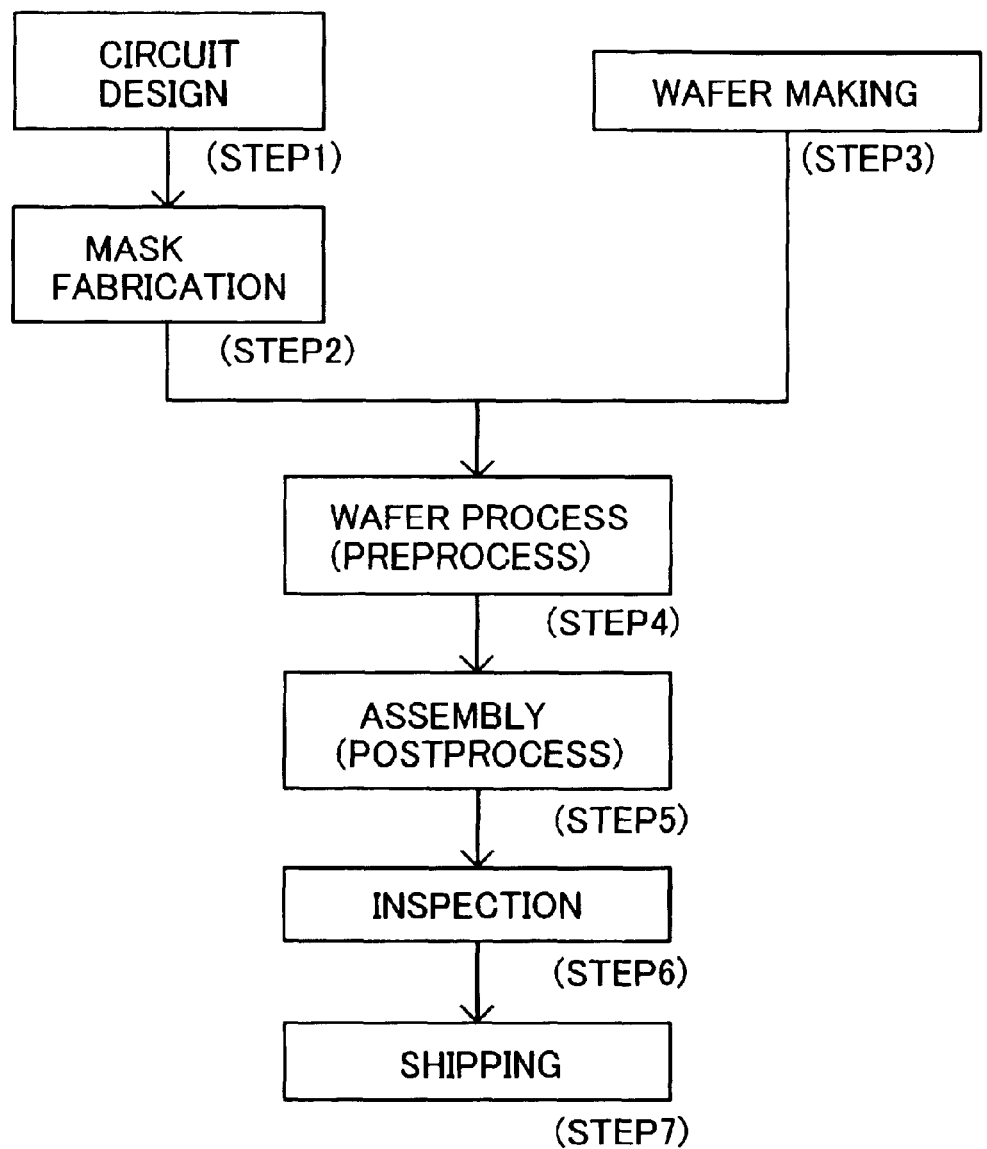
FIG. 8 is a flowchart for explaining a device fabrication method using an inventive exposure apparatus.
Figure 9:
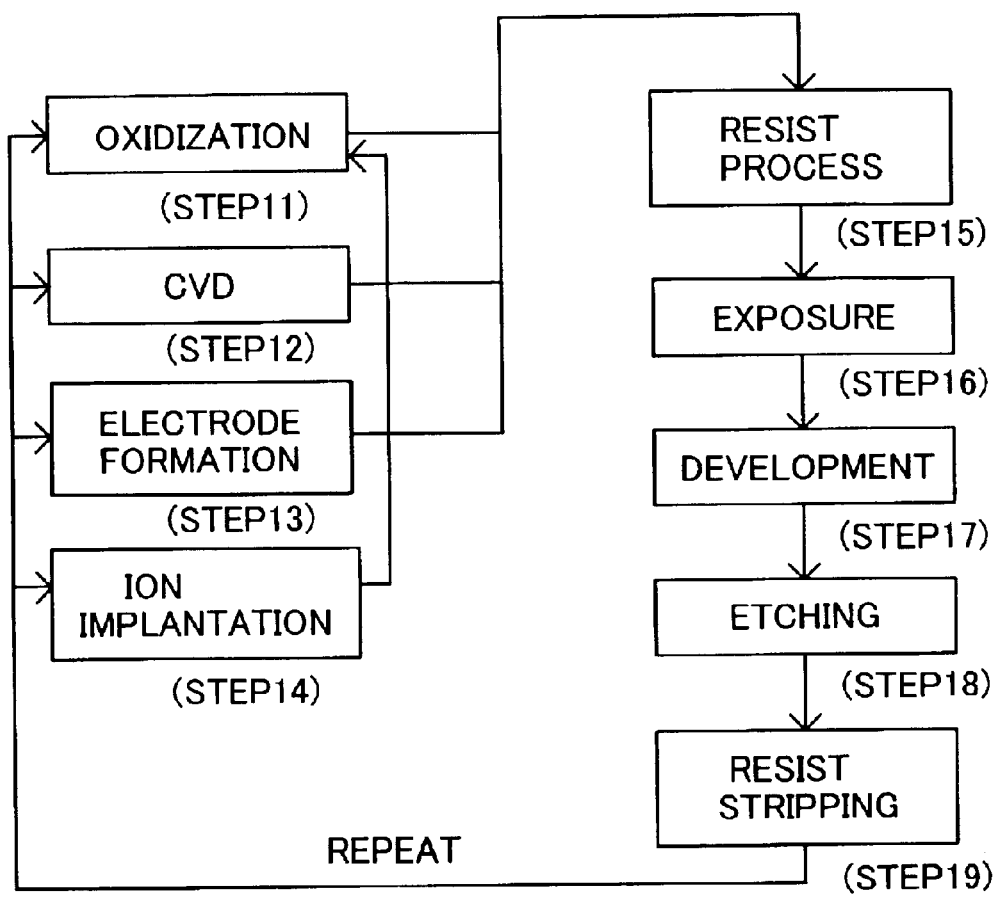
FIG. 9 is a detailed flowchart for Step 4 shown in FIG. 8.
Figure 10:
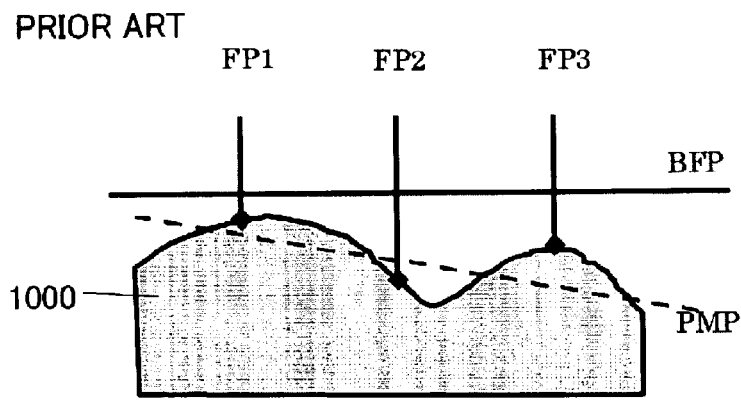
FIG. 10 is a schematic sectional view showing focus and tilt measurement positions on a wafer.
Figure 11:
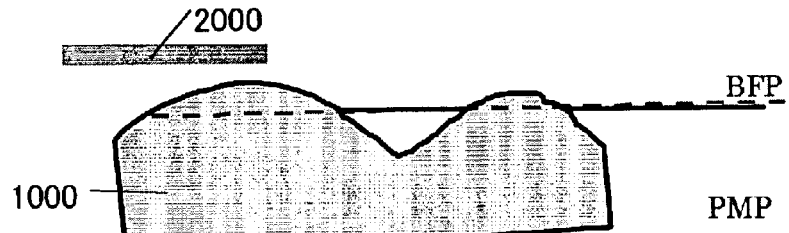
FIG. 11 is a schematic sectional view showing the wafer that has been driven to an optimal image-surface position based on the measurement result.
Figure 12:
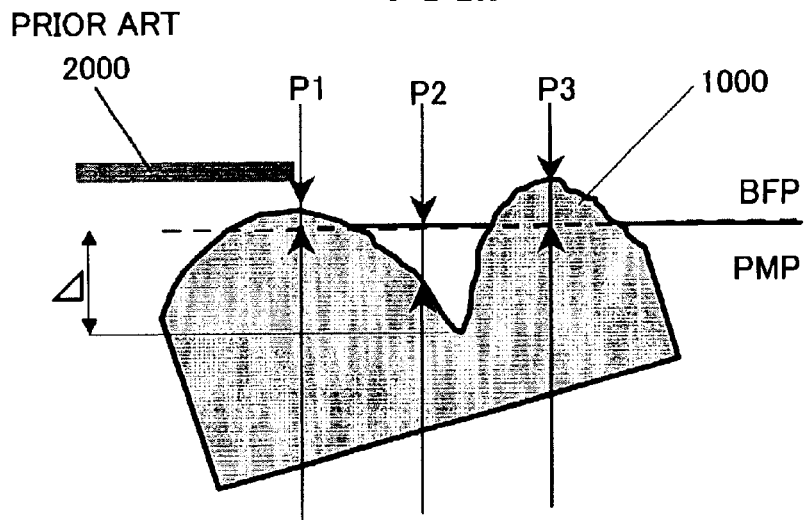
FIG. 12 is a schematic sectional view showing an offset between a pre-scan plane and the wafer.

Referring now to FIGS. 8 and 9, a description will be given of an embodiment of a device fabrication method using the above mentioned exposure apparatus 1. FIG. 8 is a flowchart for explaining how to fabricate devices (i.e., semiconductor chips such as IC and LSI, LCDs, CCDs, and the like). Here, a description will be given of the fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is also referred to as a pretreatment, forms actual circuitry on the wafer through lithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 9 is a detailed flowchart of the wafer process in Step 4 in FIG. 8. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 300 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multi-layer circuit patterns are formed on the wafer. Use of the fabrication method in this embodiment helps fabricate higher-quality devices than ever. Thus, the device fabrication method using the exposure apparatus 1 and the resultant device constitute one aspect of the present invention.

Further, the present invention is not limited to these preferred embodiments and various variations and modifications may be made without departing from the scope of the present invention.

According to the inventive exposure method and apparatus, may perform a superior focus correction for the flatness of the wafer surface without lowering the throughput. The device fabrication method using this device and method may fabricate high-quality devices.

What is claimed is:

1. An exposure apparatus which has a projection optical system and exposes an object to an image of a pattern of a mask via said projection optical system, said apparatus comprising:

a first detector which is arranged in an exposure station for exposing the object to the image and measures a position of the object in a direction parallel to an optical axis of said projection optical system with respect to each of first plural points, on the object, arranged at a first interval; and a controller which controls at least one of the position and tilt of the object based on information concerning flatness which is previously measured with respect to second plural points, on the object, arranged at a second interval smaller than the first interval, and information of the position measured by said first detector.

2. An apparatus according to claim 1, wherein said apparatus is a scanning exposure apparatus, and said first detector measures the position during a scan of the object.

3. An apparatus according to claim 1, wherein said first detector directs light to the object in a direction oblique to the object.

4. An apparatus according to claim 3, wherein said first detector directs a plurality of the light to the object.

5. An apparatus according to claim 1, further comprising a second detector which is arranged in a measurement station for measuring the object and measures the flatness.

6. An apparatus according to claim 5, wherein said controller stores the information of the flatness obtained by said second detector.

7. An apparatus according to claim 5, wherein the object is held in the same holding manner during measurements by said first and second detectors.

8. An apparatus according to claim 5, wherein said second detector measures the flatness using an interference method.

9. An apparatus according to claim 1, wherein said apparatus is a semiconductor exposure apparatus, and the information concerning flatness is obtained by previous measurement with respect to a bare wafer.

10. A device manufacturing method comprising steps of:
exposing an object to an image of a pattern of a mask using an exposure apparatus as defined in claim 1; and
developing the exposed object.

11. An exposure method of exposing an object to an image of a pattern of a mask via a projection optical system, said method comprising step of:
first measurement, with a first detector which is arranged in an exposure station for exposing the object to the image, of a position of the object in a direction parallel to an optical axis of projection optical system with respect to each of first plural points, on the object, arranged at a first interval; and
controlling at least one of the position and tilt of the object based on information concerning flatness which is previously measured with respect to second plural points, on the object, arranged at a second interval smaller than the first interval, and information of the position measured in said measuring step.

12. A method according to claim 11, wherein said method is adapted to a scanning exposure apparatus, and said first measurement step measurement step measures the positions during a scan of the object.

13. A method according to claim 11, wherein said first measurement step directs light to the object in a direction oblique to the object.

14. A method according to claim 13, wherein said first measurement step directs a plurality of the light to the object.

15. A method according to claim 11, further comprising a step of second measurement, with a second detector which is arranged in a measurement station for measuring the object of the flatness.

16. A method according to claim 11, further comprising a step of storing the information of the flatness obtained in said second measurement step.

17. A method according to claim 11, wherein the object is held in the same holding manner during measurements in said first and second measurement.

18. A method according to claim 11, wherein said second measurement step measures the flatness using an interference method.

19. A method according to claim 11, wherein said method is adapted to a semiconductor exposure apparatus, and the information concerning flatness is obtained by previous measurement with respect to a bare wafer.

* * * * *